(12) United States Patent
Kurokawa et al.

(10) Patent No.: US 8,519,981 B2
(45) Date of Patent: Aug. 27, 2013

(54) SEMICONDUCTOR DEVICE

(75) Inventors: Yoshiyuki Kurokawa, Kanagawa (JP); Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 196 days.

(21) Appl. No.: 12/941,270

(22) Filed: Nov. 8, 2010

(65) Prior Publication Data

US 2011/0109593 A1 May 12, 2011

(30) Foreign Application Priority Data

Nov. 12, 2009 (JP) ................................. 2009-258667

(51) Int. Cl.
*G06F 3/042* (2006.01)
*H04N 5/225* (2006.01)

(52) U.S. Cl.
USPC .................. 345/175; 348/222.1; 348/E05.024

(58) Field of Classification Search
USPC ......... 359/724, 725; 382/100, 141; 345/175; 348/222.1, E05.024
See application file for complete search history.

(56) References Cited

U.S. PATENT DOCUMENTS

| | | | |
|---|---|---|---|
| 5,331,428 A | 7/1994 | Uffel | |
| 6,747,638 B2 | 6/2004 | Yamazaki et al. | |
| 7,023,479 B2 * | 4/2006 | Hiramatsu et al. | 348/243 |
| 7,102,673 B2 | 9/2006 | Kimura | |
| 7,224,391 B2 | 5/2007 | Kimura | |
| 7,230,644 B2 | 6/2007 | Nakamura et al. | |
| 7,518,757 B2 * | 4/2009 | Chizawa et al. | 358/461 |
| 7,586,479 B2 | 9/2009 | Park et al. | |
| 2005/0104877 A1 | 5/2005 | Nakamura et al. | |
| 2005/0218295 A1 | 10/2005 | Nakamura et al. | |
| 2006/0017824 A1 | 1/2006 | Kohashi | |
| 2006/0119723 A1 * | 6/2006 | Hagihara | 348/308 |
| 2006/0139708 A1 | 6/2006 | Li | |
| 2010/0007632 A1 | 1/2010 | Yamazaki | |
| 2010/0013813 A1 | 1/2010 | Katoh et al. | |
| 2010/0085331 A1 | 4/2010 | Kurokawa et al. | |
| 2010/0156850 A1 | 6/2010 | Kurokawa | |
| 2010/0156851 A1 | 6/2010 | Kurokawa | |

FOREIGN PATENT DOCUMENTS

| | | |
|---|---|---|
| EP | 1 052 848 A1 | 11/2000 |
| JP | 2001-292276 | 10/2001 |
| JP | 2002-262132 | 9/2002 |

OTHER PUBLICATIONS

European Search Report (Application No. 10190347.4; EP12896) Dated Nov. 28, 2011.

* cited by examiner

*Primary Examiner* — James Wozniak
*Assistant Examiner* — Yaron Cohen
(74) *Attorney, Agent, or Firm* — Nixon Peabody LLP; Jeffrey L. Costellia

(57) ABSTRACT

An object is to reduce noise caused by variations in characteristics of photosensors provided for each pixel in a display panel having an image capturing function by the photosensors and to provide an image with high precision. A display device includes a display panel including photosensors arranged in matrix and an image processing circuit, in which the photosensors captures a black image and an image of an object; and the image processing circuit produces an image having image data (Y−X) using image data X of the black image and image data Y of the image of the object.

8 Claims, 13 Drawing Sheets

SEMICONDUCTOR DEVICE

BACKGROUND OF THE INVENTION

1. Field of the Invention

The technical field of the present invention relates to a display device and a driving method thereof. Further, the technical field of the present invention relates to a semiconductor device and a driving method thereof.

2. Description of the Related Art

In recent years, a display device provided with a display panel having a photosensor has attracted attention.

The amount of light which reaches a display panel changes when an object is in contact with or approaches the display panel. A photosensor detects change in the amount of light; accordingly, contact or approach of the object can be detected.

As an example of such a display device, a display device equipped with an image capturing function by providing a contact area sensor for a display panel is given (for example, see Patent Document 1). Further, as an example of a device without a display panel, a semiconductor device such as an image sensor can be given.

In the display device, an image is captured as follows. When an object is in contact with or approaches the display panel, light is emitted to the object from the display panel, and part of the light is reflected by the object. A photosensor is provided for a pixel of a display panel, and detects the reflected light and converts it into electrical signals so as to obtain image data; thus, an image is produced.

For capturing an image with high precision, reduction in noise caused by variations in characteristics of photosensors provided in pixels of a display panel is required. Due to the noise, a defective pixel in which an intended image can not be formed exists.

A technique to correct image data of the defective pixel is known (for example, see Patent Document 2).

Reference

[Patent Document 1] Japanese Published Patent Application No. 2001-292276
[Patent Document 2] Japanese Published Patent Application No. 2002-262132

SUMMARY OF THE INVENTION

In Patent Document 2, by using image data of an adjacent pixel of a defective pixel, intended image data is generated and the image data of the defective pixel is corrected. Accordingly, in the case where the defective pixels exist in a large area, there has been a problem that it is difficult to correct the image data.

In view of the above problems, it is an object of the present invention to reduce noise of image data without correction using an adjacent pixel of a defective pixel and to capture an image with high precision.

A photosensor is provided for a pixel of a display panel, and an image for correction is captured before an intended image is captured. When the intended image is captured, an image in which noise is reduced is produced by performing correction with the use of the image for correction. A pixel having noise is also referred to as a defective pixel.

The photosensor is reset when a predetermined signal is input in a reset operation. The image for correction may be captured by generating image data from a signal input in the reset operation. By setting the size of the signal in the reset operation, a desired image can be captured automatically.

The number of images captured for correction may be one or more.

One embodiment of the present invention is a display device which includes a display panel in which photosensors are arranged in matrix and an image processing circuit, in which the photosensors capture a black image and an image of an object, and the image processing circuit produces an image having image data (Y−X) using image data X of the black image and image data Y of the image of the object.

One embodiment of the present invention is a display device which includes a display panel in which photosensors are arranged in matrix and an image processing circuit, in which the photosensors capture a white image and an image of an object, and the image processing circuit produces an image having image data (Y+(MAX−X)) using image data X of the white image and image data Y of the image of the object, with a maximum value of the gray scale as MAX.

One embodiment of the present invention is a display device which includes a display panel in which photosensors are arranged in matrix and an image processing circuit, in which the photosensors capture a black image, a white image, and an image of an object, and the image processing circuit produces an image having image data (MAX×(Z−X)/(Y−X)) using image data X of the black image and image data Y of the white image and image data Z of the image of the object, with a maximum value of the gray scale as MAX.

Furthermore, the display device includes a memory device which stores each of the images captured in the photosensors.

In addition, the black image and the white image are images for correction, and are captured in the reset operation of the photosensors.

According to the present invention, a display device capable of capturing an image with high precision can be provided.

BRIEF DESCRIPTION OF THE DRAWINGS

In the accompanying drawings.

DETAILED DESCRIPTION OF THE INVENTION

Figure 1:
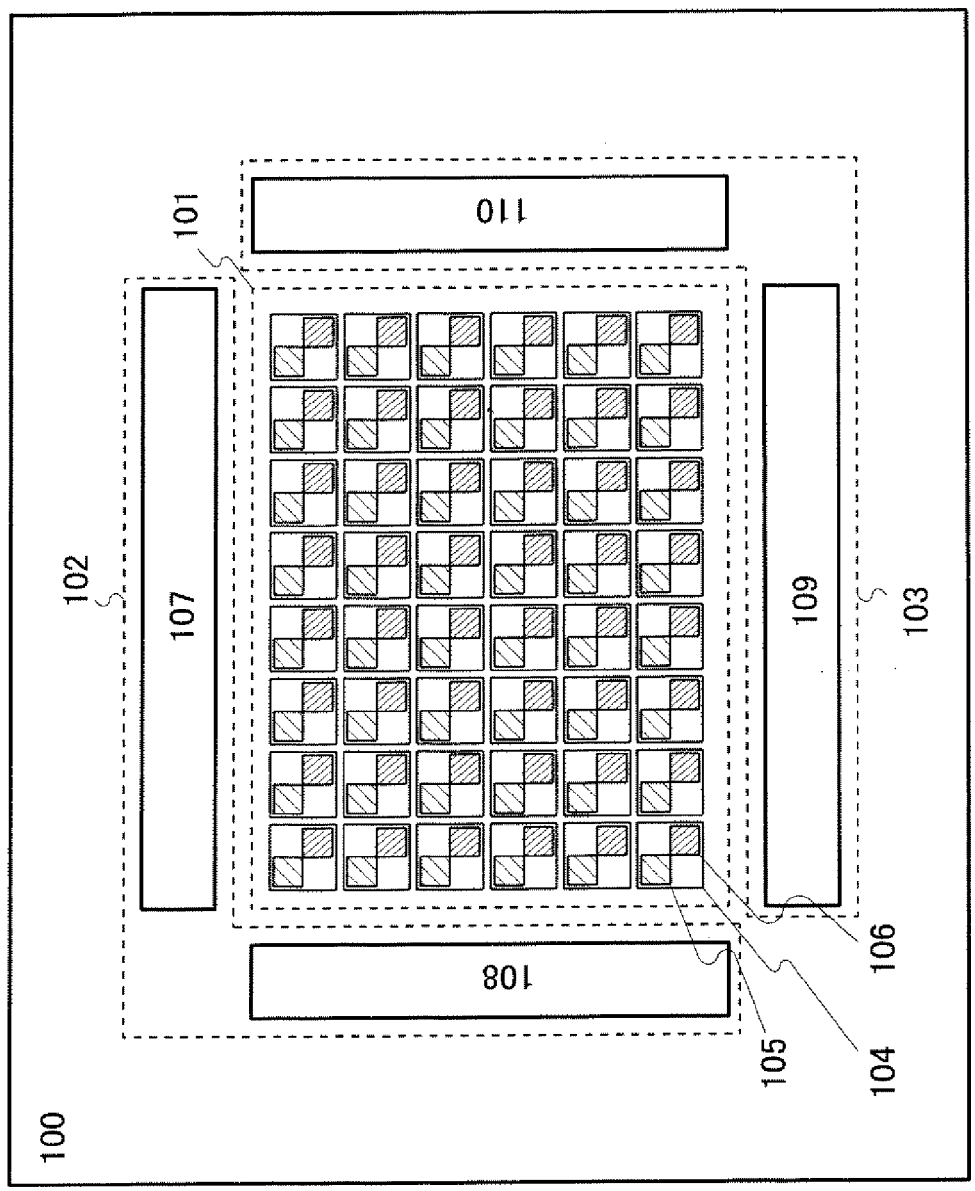
FIG. 1 illustrates a structure of a display device.

Hereinafter, embodiments will be described in detail with reference to the accompanying drawings. However, since embodiments described below can be embodied in many different modes, it is easily understood by those skilled in the art that the mode and the detail can be variously changed without departing from the scope of the present invention. Therefore, the disclosed invention is not interpreted as being limited to the description of the embodiments below. In the drawings for explaining the embodiments, the same parts or parts having a similar function are denoted by the same reference numerals, and description of such parts is not repeated.

(Embodiment 1)

In this embodiment, a display device will be described with reference to FIG. 1 to FIG. 5.

A structure of a display panel will be described with reference to FIG. 1. A display panel 100 includes a pixel circuit 101, a display element control circuit 102, and a photosensor control circuit 103. The pixel circuit 101 includes a plurality of pixels 104 arranged in a matrix of rows and columns. Each of the pixels 104 includes a display element 105 and a photosensor 106. Note that the photosensor 106 may be provided outside the pixel 104. Further, the number of photosensors 106 may be different from that of display elements 105.

Each of the display elements 105 includes a thin film transistor (TFT), a storage capacitor, a liquid crystal element, and the like. The thin film transistor has a function of controlling injection or ejection of charge to/from the storage capacitor. The storage capacitor has a function for holding charge which corresponds to voltage applied to the liquid crystal element. Gray scales display is performed by applying voltage to the liquid crystal element and controlling whether to transmit light or not. Light that a light source (a backlight) emits from the rear side of a liquid crystal display device is used as the light passing through the liquid crystal element.

Note that methods of displaying color images include a method in which a color filter is used, that is, a color filter method. This method makes it possible to produce the gray scales of a particular color (e.g., red (R), green (G), or blue (B)) when light that has passed through the liquid crystal layer passes through a color filter. Here, when the color filter method is employed, the pixel 104 that has the function of emitting red (R) light, the pixel 104 that has the function of emitting green (G) light, and the pixel 104 that has the function of emitting blue (B) light are called an R pixel, a G pixel, and a B pixel, respectively.

Methods of displaying color images also include a method in which respective light sources of particular colors (e.g., red (R), green (G), and blue (B)) are used as a backlight, and are sequentially lit, that is, a field-sequential method. In the field-sequential method, the gray scale of each of the colors can be given by making the contrast of light passing through the liquid crystal layer while the light source thereof is turned on.

Note that the case where each of the display elements 105 includes a liquid crystal element is described above; however, other elements such as a light emitting element may be included instead. The light emitting element is an element in which the luminance is controlled by current and voltage. Specifically, light emitting diode, OLED (organic light emitting diode), and the like are given.

The photosensor 106 includes an element (also referred to as a light receiving element) which has a function of generating an electrical signal when receiving light, and a thin film transistor. A photodiode and the like can be used as the light receiving element. Note that light which the photosensor 106 receives is light emitted from inside (such as back light) of a display device and reflected by an object, outside light or the like reflected by an object, light emitted from an object itself, light which is outside light blocked by an object (shadow), or the like.

The display element control circuit 102 controls the display elements 105 and includes a display element driver circuit 107 which inputs a signal to the display elements 105 through signal lines (also referred to as source signal lines) such as video data signal lines, and a display element driver circuit 108 which inputs a signal to the display elements 105 through scanning lines (also referred to as gate signal lines). For example, the display element driver circuit 108 on the scanning line side has a function of selecting the display elements included in the pixels placed in a particular row. The display element driver circuit 107 on the signal line side has a function of applying a predetermined potential to the display elements included in the pixels placed in the selected row. Note that in the display element to which the display element driver circuit 108 on the scanning line side applies high potential, the thin film transistor is conducting state, so that the display element is provided with charge from the display element driver circuit 107 on the signal line side.

The photosensor control circuit 103 controls the photosensors 106 and includes a photosensor reading circuit 109 on the signal line side such as a photosensor output signal line and a photosensor reference signal line, and a photosensor driver circuit 110 on the scanning line side. The photosensor driver circuit 110 on the scanning line side has a function of performing a reset operation and a selecting operation on the photosensors 106 included in the pixels placed in a particular row, which are described below. Further, the photosensor reading circuit 109 on the signal line side has a function of taking out an output signal of the photosensors 106 included in the pixels in the selected row. Note that the photosensor read out circuit 109 on the signal line side can have a structure in which an output, which is an analog signal, of the photosensor is extracted as an analog signal to the outside of the display panel by an OP amplifier; or a structure in which the output is converted into a digital signal by an A/D converter circuit and then extracted to the outside of the display panel.

A circuit diagram of the pixel 104 will be described with reference to FIG. 2. The pixel 104 includes the display element 105 including a transistor 201, a storage capacitor 202, and a liquid crystal element 203, and the photosensor 106 including a photodiode 204, a transistor 205, and a transistor 206.

As for the transistor 201, a gate is electrically connected to a gate signal line 207, one of a source and a drain is electrically connected to a video data signal line 210, and the other one of the source and the drain is electrically connected to one electrode of the storage capacitor 202 and one electrode of the liquid crystal element 203. The other electrode of the storage capacitor 202 and the other electrode of the liquid crystal element 203 are held at a certain potential. The liquid crystal element 203 includes a pair of electrodes and a liquid crystal layer sandwiched between the pair of electrodes.

When "H" (high) is applied to the gate signal line 207, the transistor 201 supplies the potential of the video data signal line 210 to the storage capacitor 202 and the liquid crystal element 203. The storage capacitor 202 holds the applied potential. The liquid crystal element 203 changes light transmittance in accordance with the applied potential.

As for the photodiode 204, one electrode is electrically connected to a photodiode reset signal line 208, and the other electrode is electrically connected to a gate of the transistor 205. One of a source and a drain of the transistor 205 is electrically connected to a photosensor reference signal line 212, and the other of the source and the drain of the transistor 205 is electrically connected to one of a source and a drain of the transistor 206. A gate of the transistor 206 is electrically connected to a gate signal line 209, and the other of the source and the drain of the transistor 206 is electrically connected to a photosensor output signal line 211.

Figure 3:
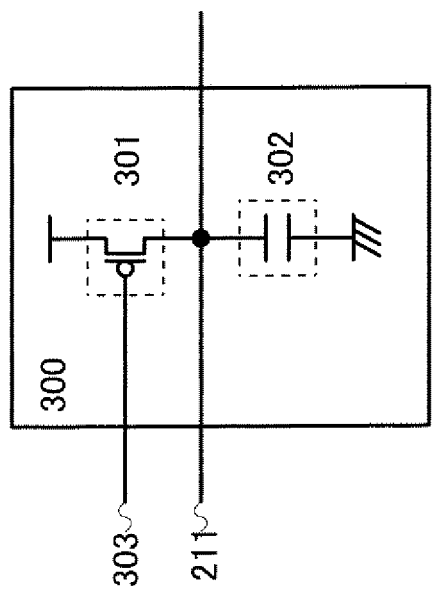
FIG. 3 illustrates a structure of a display device.

Next, the structure of the photosensor reading circuit 109 will be described with reference to FIG. 3. In FIG. 3, a photosensor read out circuit 300 for one column of pixels includes a p-type transistor 301 and a storage capacitor 302. Further, the photosensor read out circuit 300 includes a photosensor output signal line 211 and a precharge signal line 303 which are for the one column of pixels.

In the photosensor read out circuit 300, the potential of the photosensor output signal line 211 is set at a reference potential before the operation of the photosensor in the pixel. In FIG. 3, by setting a potential of the precharge signal line 303 at "L" (low), the potential of the photosensor output signal line 211 can be set to a high potential which is a reference potential. Note that it is acceptable that the storage capacitor 302 is not provided if the photosensor output signal line 211 has large parasitic capacitance. Note that the reference potential can be a low potential. In that case, an n-channel transistor is used and the potential of the precharge signal line 303 is set at "H", whereby the potential of the photosensor output signal line 211 can be set to a low potential which is a reference potential.

Figure 4:
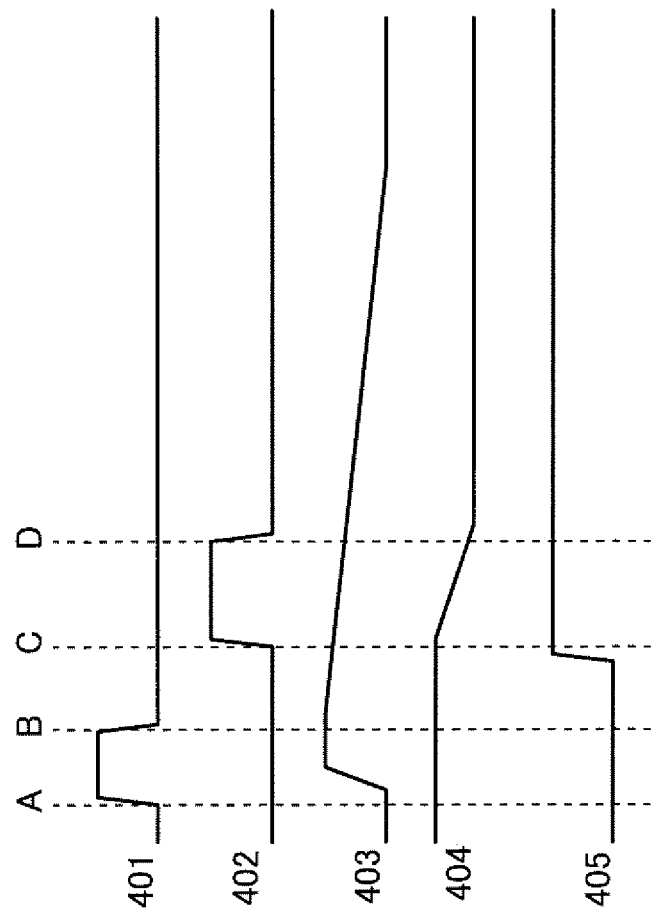
FIG. 4 illustrates a timing chart.

Next, a reading operation of the photosensor of the display panel will be described with reference to a timing chart in FIG. 4. In FIG. 4, a signal 401 corresponds to the potential of the photodiode reset signal line 208 in FIG. 2, a signal 402 corresponds to the potential of the gate signal line 209 in FIG. 2 to which the gate of the transistor 206 is connected, a signal 403 corresponds to the potential of a gate signal line 213 in FIG. 2 to which the gate of the transistor 205 is connected, and a signal 404 corresponds to the potential of the photosensor output signal line 211 in FIG. 2. Further, a signal 405 corresponds to the potential of the precharge-signal line 303 in FIG. 3.

At a time A, when the potential of the photodiode reset signal line 208 (the signal 401) is set at "H" (reset operation), the photodiode 204 is brought into conduction, and the potential of the gate signal line 213 (the signal 403) to which the gate of the transistor 205 is connected becomes "H". Further, when the potential of the precharge signal line 303 (the signal 405) is set at "L", the potential of the photosensor output signal line 211 (the signal 404) is precharged to "H".

At a time B, when the potential of the photodiode reset signal line 208 (the signal 401) is set at "L" (accumulating operation), the potential of the gate signal line 213 to which the gate of the transistor 205 is connected (the signal 403) begins to be lowered due to off current of the photodiode 204. The off current of the photodiode 204 increases when light is delivered thereto; therefore, the potential of the gate signal line 213 (the signal 403) to which the gate of the transistor 205 is connected changes in accordance with the amount of the light delivered to the photodiode 204. That is, current between a source and a drain of the transistor 205 changes.

At a time C, when the potential of the gate signal line 209 (the signal 402) is set at "H" (selecting operation), the transistor 206 is brought into conduction and the photosensor reference signal line 212 and the photosensor output signal line 211 are brought into conduction through the transistor 205 and the transistor 206. Then, the potential of the photosensor output signal line 211 (the signal 404) gets lower and lower. Note that previous to the time C, the potential of the precharge signal line 303 (the signal 405) is set at "H" and the precharge of the photosensor output signal line 211 is completed. Here, a speed with which the potential of the photosensor output signal line 211 (the signal 404) is lowered depends on the source-drain current of the transistor 205. That is, the speed with which the potential of the photosensor output signal line 211 changes in accordance with the amount of light delivered to the photodiode 204.

At a time D, when the potential of the gate signal line 209 (the signal 402) is set at "L", the transistor 206 is turned off, and the potential of the photosensor output signal line 211 (the signal 404) has a specific value from the time D. Here, the value as the specific value changes in accordance with the amount of light delivered to the photodiode 204. Therefore, the amount of light delivered to the photodiode 204 can be found by obtaining the potential of the photosensor output signal line 211.

As described above, an operation of individual photosensors is realized by repeating the reset operation, the accumulating operation, and the selecting operation. Further, the above operations are sequentially performed on the photosensors included in the pixels of all rows and all columns of a display panel, and the potentials of the photosensor output signal line 211 obtained at the time are sequentially obtained, whereby a captured image can be produced.

The photosensors provided for each pixel have variations in characteristics because of variations caused in manufacturing. The variations caused in manufacturing include variations in photocurrent of a photodiode, threshold value or on current of a transistor, wiring resistance or a parasitic capacitance of a photosensor output signal line, and the like. These variations cause the problems of mixing of a whitish pattern in a position which should be black in the obtained captured image, or mixing of blackish pattern in a position which should be white in the obtained captured image. Further, in the case where the photosensor read out circuit 109 on the signal line side is provided with an OP amplifier or an A/D converter circuit, a streaky pattern is mixed in the captured image due to the variations in characteristics. The quality of the resulting captured image to be an object is lost by such noise.

Generally, the variation caused in manufacturing can be reduced by increase in size of a photodiode and a transistor included in a photosensor, widening of a signal wiring, increase in a thickness of an interlayer insulating film, and the like. In addition, a variation correction circuit may be installed in the photosensor. However, because an aperture ratio is required to be secured in the display panel, there are severe restrictions on the number and the sizes of photodiodes and transistors; thus, it is not easy to increase the size of the element, to widen the signal wiring and to introduce the correction circuit. Furthermore, the increase in a thickness of an interlayer insulating film is also difficult because a manufacturing cost is increased and transmittance of a pixel is decreased. Accordingly, the present invention proposes quality improvement of a captured image according to the following method. In the method, before capturing an aimed image, at least one of a black image or a white image is captured so as to be used for image correction with respect to the aimed image. The black image or the white image can be easily obtained by mounting black paper or white paper on a display panel and capturing its image.

The specific methods of image correction are as follows: (1) a method in which the first image data X of a captured black image and the second image data Y of the captured image are used to obtain third image data (Y−X) as the aimed captured image data (2) a method in which the first image data X of a captured white image and the second image data Y of the captured image are used to obtain the third image data (Y+(gray scale level−X)) as the aimed captured image data and (3) a method in which the first image data X of the captured black image, the second image data Y of the captured white image, and the third image data Z of the captured image in a range where the first image data X and the second image data Y are a minimum value and a maximum value are used and linear distribution of the first image data, the second image data and the third image data Z are performed, respectively to obtain fourth image data ((Z−X)/(Y−X)×gray scale level) as the aimed captured image data. Here, the image data X (Y, or Z) means data (gray scale data) in which the gray scale of each pixel is expressed by a numeric value. Further, the four rules of arithmetic to the image data is performed on the gray scale data in the image data of each pixel. For example, in the image data (Y−X), the gray scale data of each pixel is obtained by taking difference between gray scale data of each pixel of image data X and gray scale data of corresponding pixel of image data Y. In addition, the number of the gray scale data is larger as the image is bright. Further, as for a color image, the gray scale data of each pixel includes gray scales of three colors of R, G, and B, and the four rules of arithmetic is performed on each of R, G, and B. The gray scale level refers to that of the captured image, and in the case of a color image, each of the gay scale levels of R, G, and B.

Figure 2:
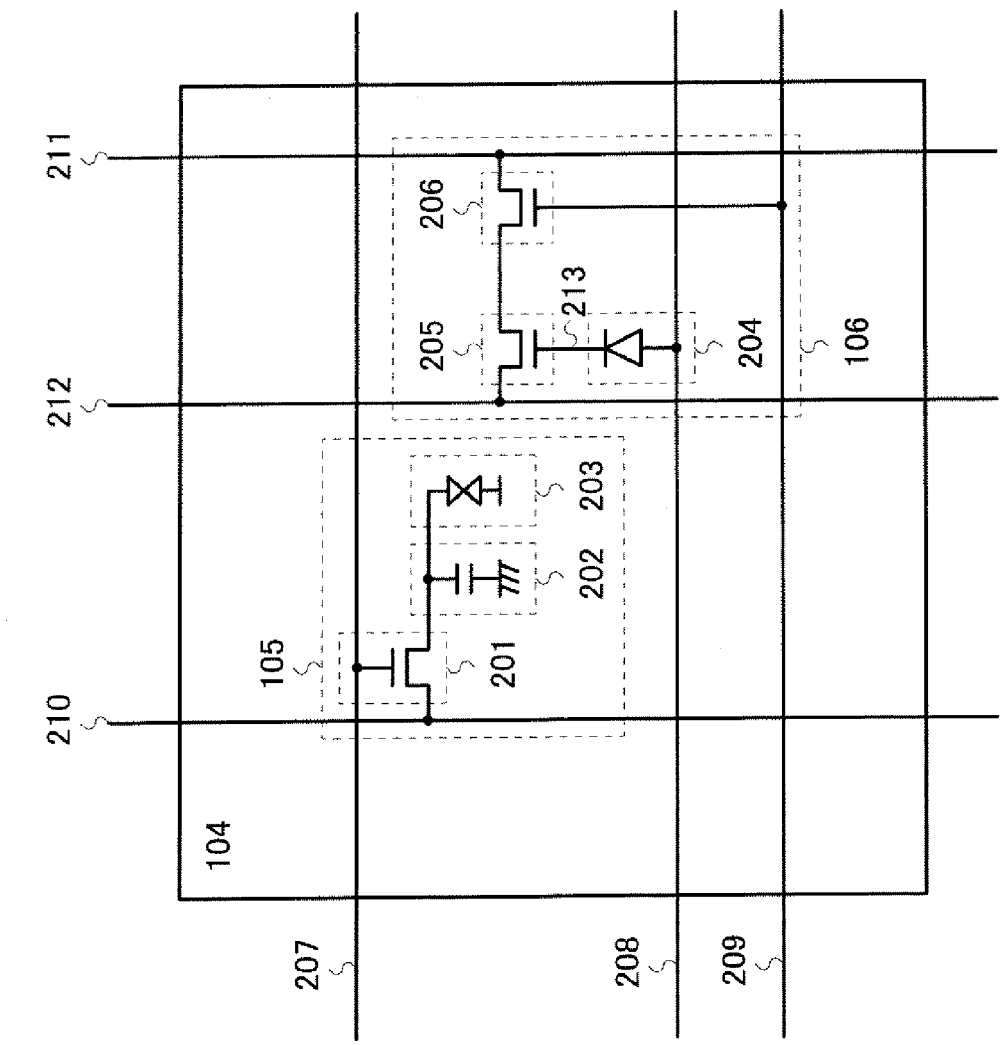
FIG. 2 illustrates a structure of a display device.

The method (1) is effective in the case where variations caused in manufacturing is likely to cause noise in a black image, for example, in the case where a variation in on current of a transistor 205 is large or in the case where a variation in dark current or a photoelectric current caused by weak light of the photodiode 204 is large in the photosensor 106 illustrated in FIG. 2. Note that when the noise is generated in the whole black image, a whitish image will be obtained. Thus, brightness of the aimed captured image can be controlled by adding a specific value to the data of all the pixels. Furthermore, in the case of a color image, it is effective to add respective specific values to each of R, G, and B.

The method (2) is effective in the case where variations caused in manufacturing is likely to cause noise in a white image, for example, in the case where a variation in a threshold value of the transistor 205 is large or in the case where a variation in a photoelectric current of the photodiode 204 by strong light is large in the photosensor 106 illustrated in FIG. 2. Note that when the noise is generated in the whole white image, a blackish image will be obtained. Thus, brightness of the aimed captured image can be controlled by subtracting a specific value from the whole pixel data. Furthermore, in the case of color image, it is effective to subtract respective specific values from each of R, G, and B.

The method (3) is put to practical use of the methods (1) and (2), and is effective in various variations of photosensors. In addition, it is effective to conduct nonlinear distribution, which is more common, instead of the linear distribution. Note that linear distribution is that change in the corrected image data is proportion to change in image data of an object (for example, image data Z). Further, nonlinear distribution is that change in the corrected image data is not proportion to the change in the image data Z.

In the case of applying the methods (1) to (3), it is effective to remove randomly-generated noise (hereinafter referred to as random noise) caused by thermal noise in the captured image in the image data X, Y, and Z. In order to remove the random noise, it is effective to conduct general image processing such as smoothing processing and arithmetic processing by which a mean value and a central value are obtained from a plurality of captured images that are captured successively.

Figure 5:
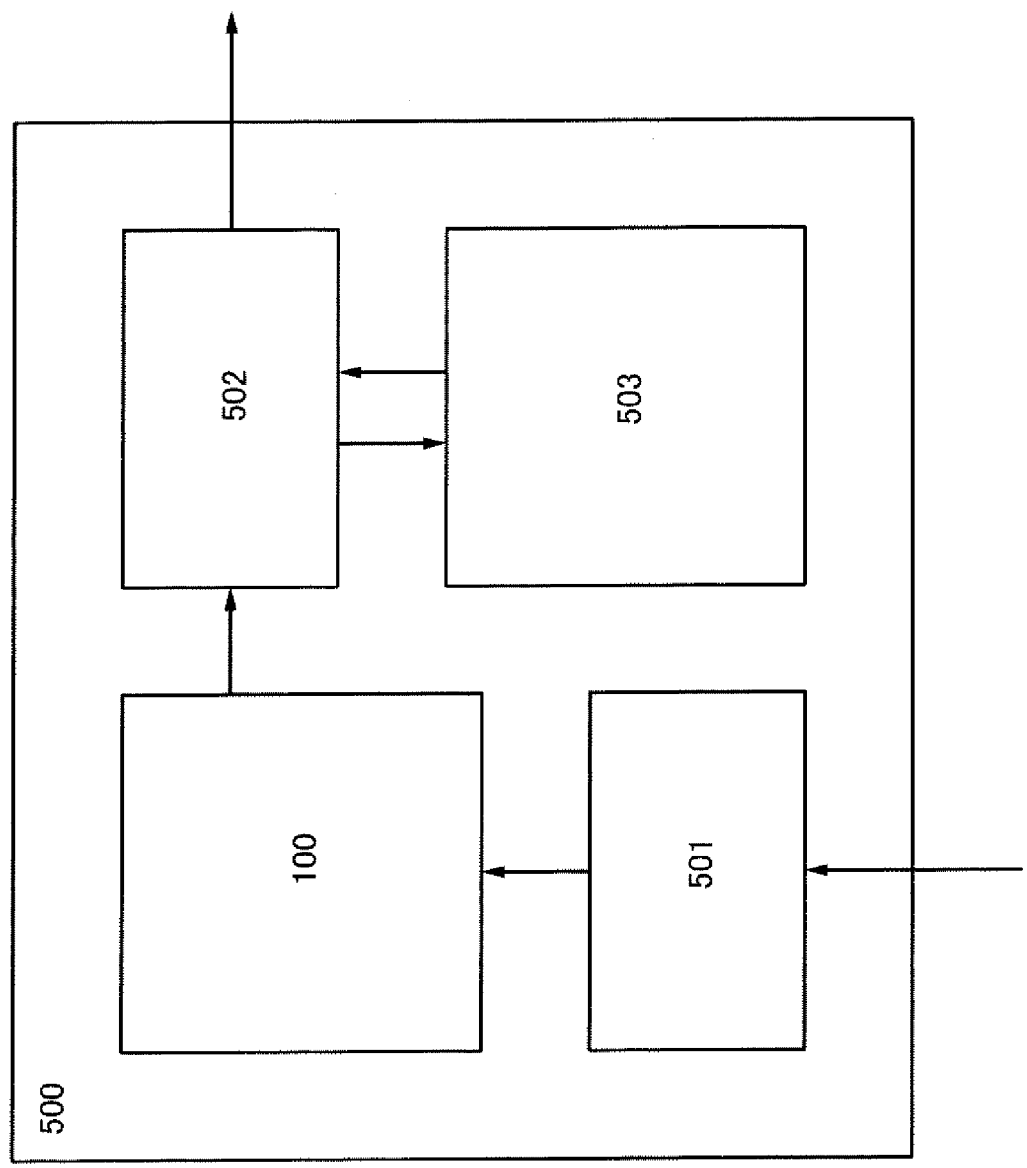
FIG. 5 illustrates a structure of a display device.

FIG. 5 illustrates a display panel system 500 which performs the above-mentioned correction. Here, the display panel system 500 includes a display panel 100, a control circuit 501, an image processing circuit 502, and a memory device 503 which stores image data. The control circuit 501 generates various timing signals for driving the display panel 100. The image processing circuit 502 performs arithmetic processing on the image data obtained by the photosensor and generates image data. Furthermore, the image processing circuit 502 stores image data needed in the subsequent image processing in the memory device 503, and reads out the data stored in the memory device 503 and performs arithmetic processing thereon if needed.

In the structure illustrated in FIG. 5, in the case of applying the methods (1) or (2), only one of the black image data or white image data is stored in the memory device 503; thus, capacity of the memory device 503 can be small.

In the case where the variations in manufacturing the display panel 100 are small, a range of gray scale data of each pixel in black image data and white image data can be limited. In that case, the structure can be as follows: the data that specifies the range of the gray scale data is stored in a memory device that is prepared separately and only the gray scale data in the limited range is stored in the memory device 503. In the case of performing arithmetic processing using the method (1) to (3), the data that specifies the range of the gray scale data and the gray scale data in the limited range are read out from each of the memory devices, and arithmetic processing is performed on the image processing circuit 502 with the use of these data. Note that the higher-order bit can be the data that specifies the range of each of the gray scale data and the lower-order bit can be the gray scale data in the limited range, respectively. This structure is effective because the capacity of the memory device 503 can be reduced.

Specific examples of the methods (1) to (3) are described with reference to FIGS. 11A to 11C.

In FIGS. 11A to 11C, 9 pixels of 3×3 pixels (length×width) are illustrated for simple description. The number in each pixel shows image data. However, the number of pixels is not limited to this.

Figure 11A:
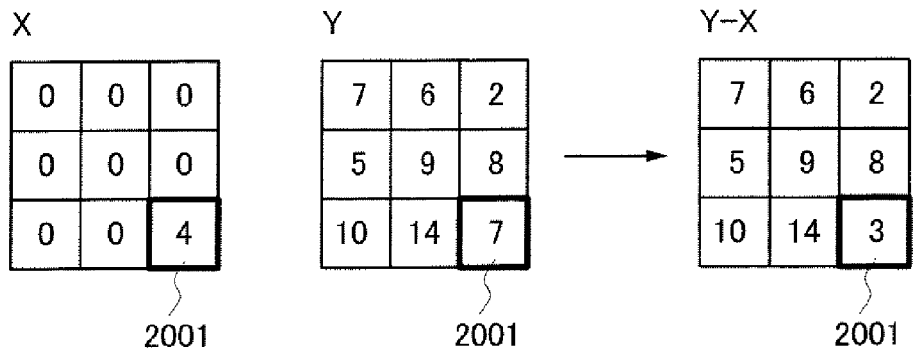
FIGS. 11A to 11C illustrate examples of image processing methods.

FIG. 11A shows a procedure of a method (1).

First, image data X of a captured black image is obtained. In the pixels with a numeric value 0, black is captured properly; on the other hand, a pixel 2001 includes noise. The value of the noise is 4, and the image of the pixel 2001 is slightly whitish. The black image data X including the noise is stored in the memory device 503.

Next, image data Y of a captured object is obtained. Here, the pixel 2001 includes the noise with a value of 4, and the object is not captured properly. The image data Y of the object is stored in the memory device 503.

Then, in the image processing circuit 502, image processing is performed using the black image data X and the image data Y of the object, whereby an image having the image data (Y−X) is produced. The produced image is the correct captured image in which the noise with a value of 4 is removed in the pixel 2001. As described above, the image including noise can be corrected.

Figure 11B:
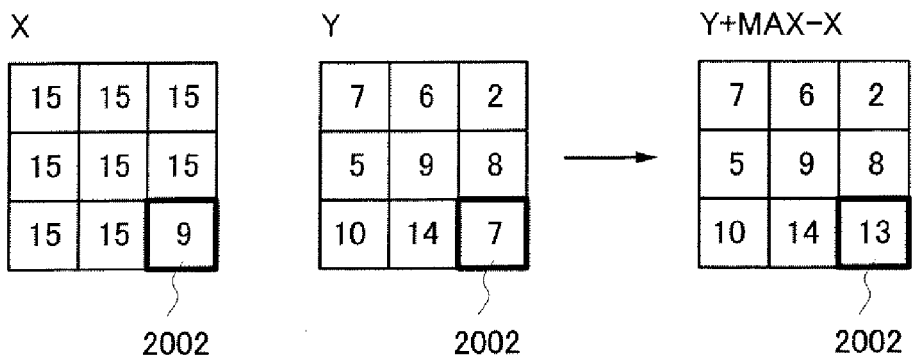

FIG. 11B shows a procedure of the method (2).

First, image data X of a captured white image is obtained. In the pixels with a numeric value 15, white is captured properly; on the other hand, a pixel 2002 includes noise. The value of the noise is 6, and the image is blackish slightly. The white image data X including the noise is stored in the memory device 503.

Next, image data Y of a captured object is obtained. Here, the pixel 2002 includes the noise with a value of 6, and the object is not captured properly. The image data Y of the object is stored in the memory device 503.

Then, in the image processing circuit 502, image processing is performed using the white image data X and the image data Y of the object, whereby an image having the image data (Y+(MAX−X)) is produced. The produced image is the correct captured image in which the noise with a value of 6 is removed in the pixel 2002. As described above, the image including noise can be corrected. MAX indicates a maximum value in 16 level of gray, and here, MAX is 15. The gray scale level has the same meaning as the MAX.

Figure 11C:
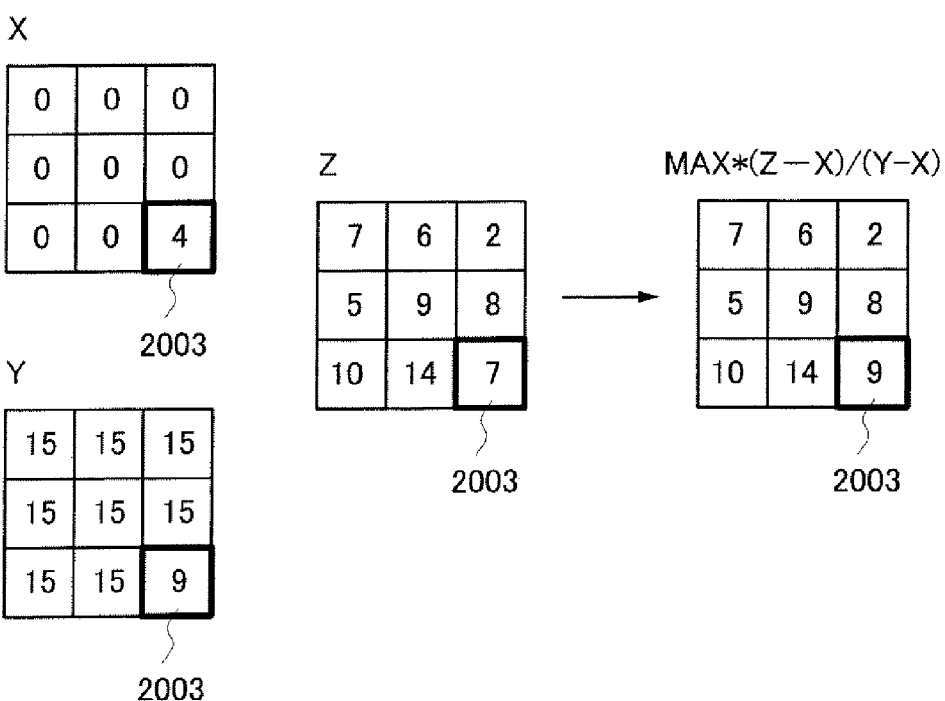

FIG. 11C shows a procedure of the method (3).

First, image data X of a captured black image and image data Y of a captured white image are obtained. As in the case of FIGS. 11A and 11B, the black image is whitish in the pixel 2003, and the white image is blackish in the pixel 2003. These image data X and Y are stored in the memory device 503.

Next, image data Z of a captured object is obtained. Here, the pixel 2003 includes the noise with values of 4 and 6, and the object is not captured properly. The image data Z of the object is stored in the memory device 503.

Then, in the image processing circuit 502, image processing is performed using the black image data X, the white image data Y, and the image data Z of the object, whereby an image having the image data (MAX×(Z−X)/(Y−X)) is produced. The produced image is the correct captured image in which the noise with values of 4 and 6 are removed. As described above, the image including noise can be corrected. As in the case of the method (2), MAX is 15.

Note that a black-and-white image is used in this embodiment; however, a color image composed of the values of R, G, and B, respectively, may be used. In that case, the image processing may be performed on each of the R, G, and B. Further, the value of RGB may be converted into HSV (H: hue; S: saturation value; V: value) and then the processing may be performed.

Further, 4-bit display (16 level of gray display) is performed; however the number of bits may be different.

With the above structure, a display panel capable of capturing an image with high precision can be provided.

In this embodiment, a display device having a photosensor is described; however, the present invention can be easily applied to a semiconductor device having a photosensor. That is, a semiconductor device can be formed by removing a circuit needed for a display, specifically, the display element control circuit 102 and the display element 105 from the display device of the present embodiment. As such a semiconductor device, for example, an image sensor can be given. In such a semiconductor device, an object which is in contact with or approaches an input portion where a photosensor is provided can be detected in a similar manner to the aforementioned.

This embodiment can be implemented in combination with any other embodiments and examples as appropriate.

(Embodiment 2)

Figure 6:
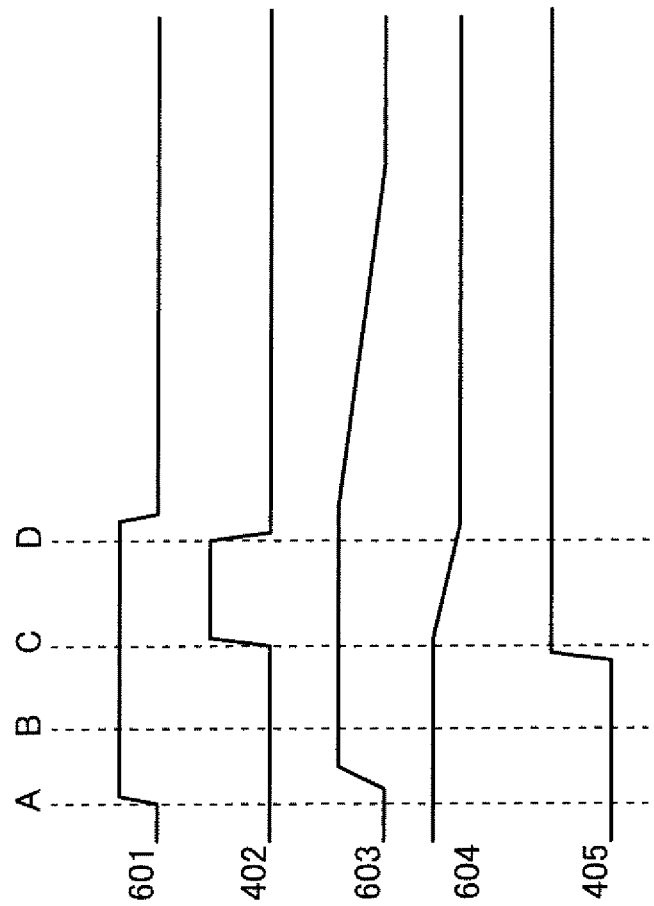
FIG. 6 illustrates a timing chart.

In this embodiment, with reference to a timing chart of FIG. 6, an image capturing method of a black image or a white image is described using a method which is different from that described in Embodiment 1. In the timing chart of FIG. 6, a signal 601 corresponds to the potential of the photodiode reset signal line 208 in FIG. 2, a signal 402 corresponds to the potential of the gate signal line 209 in FIG. 2 to which the gate of the transistor 206 is connected, a signal 603 corresponds to the potential of a gate signal line 213 in FIG. 2 to which the gate of the transistor 205 is connected, and a signal 604 corresponds to the potential of the photosensor output signal line 211 in FIG. 2. Further, a signal 405 corresponds to the potential of the precharge-signal line 303 in FIG. 3. Hereinafter, description is made with attention given to difference from the timing chart illustrated in FIG. 4.

At a time A, the potential of the photodiode reset signal line 208 (signal 601) is set to a specified potential (reset operation). Here, in the case of capturing a black image, the specified potential is the first potential that is the same potential as "H" in the timing chart of FIG. 4. Further, in the case of capturing a white image, the specified potential is ideally set as the second potential that is obtained by adding a forward voltage drop value of the photo diode 204 to the threshold value of the transistor 205 in FIG. 2. In reality, the minimum potential with which the photodiode 204 can be brought into conduction is set as the second potential. At that time, the potential of the gate signal line 213 (signal 603) to which the gate of the transistor 205 is connected has a lower value by the forward voltage drop value of the photodiode 204 from the first potential. Further, when the potential of the precharge signal line 303 (the signal 405) is set at "L", the potential of the photosensor output signal line 211 (the signal 604) is precharged to "H".

At a time B, the potential of the photodiode reset signal line 208 (signal 601) holds the potential as it is at a time A. That is, the potential of the gate signal line 213 to which the gate of the transistor 205 is connected (signal 603) does not change.

At a time C, when the potential of the gate signal line 209 (the signal 402) is set at the potential "H" (selecting operation), the transistor 206 is brought into conduction and the photosensor reference signal line 212 and the photosensor output signal line 211 are brought into conduction through the transistor 205 and the transistor 206. Then, the potential of the photosensor output signal line 211 (the signal 604) gets lower and lower. Note that previous to the time C, the potential of the precharge signal line 303 (the signal 405) is set at "H" and the precharge of the photosensor output signal line 211 is completed. Here, a speed with which the potential of the photosensor output signal line 211 (the signal 604) is lowered depends on the source-drain current of the transistor 205. That is, the speed with which the potential of the photosensor output signal line 211 is lowered changes according to the voltage applied to the photodiode reset signal line 208 (signal 601) in the reset operation. Specifically, in the case where the first potential is applied to the photodiode reset signal line 208, the potential of the photosensor output signal line 211 (signal 604) changes similarly to the case where the amount of light reaching the photodiode 204 is small in the timing chart of FIG. 4, that is, the case where a black image is captured. In addition, in the case where the second potential is applied to the photodiode reset signal line 208, the potential of the photosensor output signal line 211 (signal 604) changes similarly to the case where the amount of light reaching the photodiode 204 is large in the timing chart of FIG. 4, that is the case where a white image is captured.

At a time D, when the potential of the gate signal line 209 (the signal 402) is set at "L", the transistor 206 is turned off, and the potential of the photosensor output signal line 211 (the signal 604) has a specific value from the time D. Here, the value to be specific depends on the voltage applied to the photodiode reset signal line 208 in the reset operation. Therefore, by obtaining the potential of the photosensor output signal line 211, image data corresponding to the case where a black image or a white image is captured can be obtained.

According to the above-described mode, in the case of capturing a black image or a white image for correction, a step of mounting black paper or white paper on a display panel can be omitted, and a display device capable of capturing an image with high precision can be provided.

This embodiment can be implemented in combination with any other embodiments and examples as appropriate.

(Embodiment 3)

Figure 7:
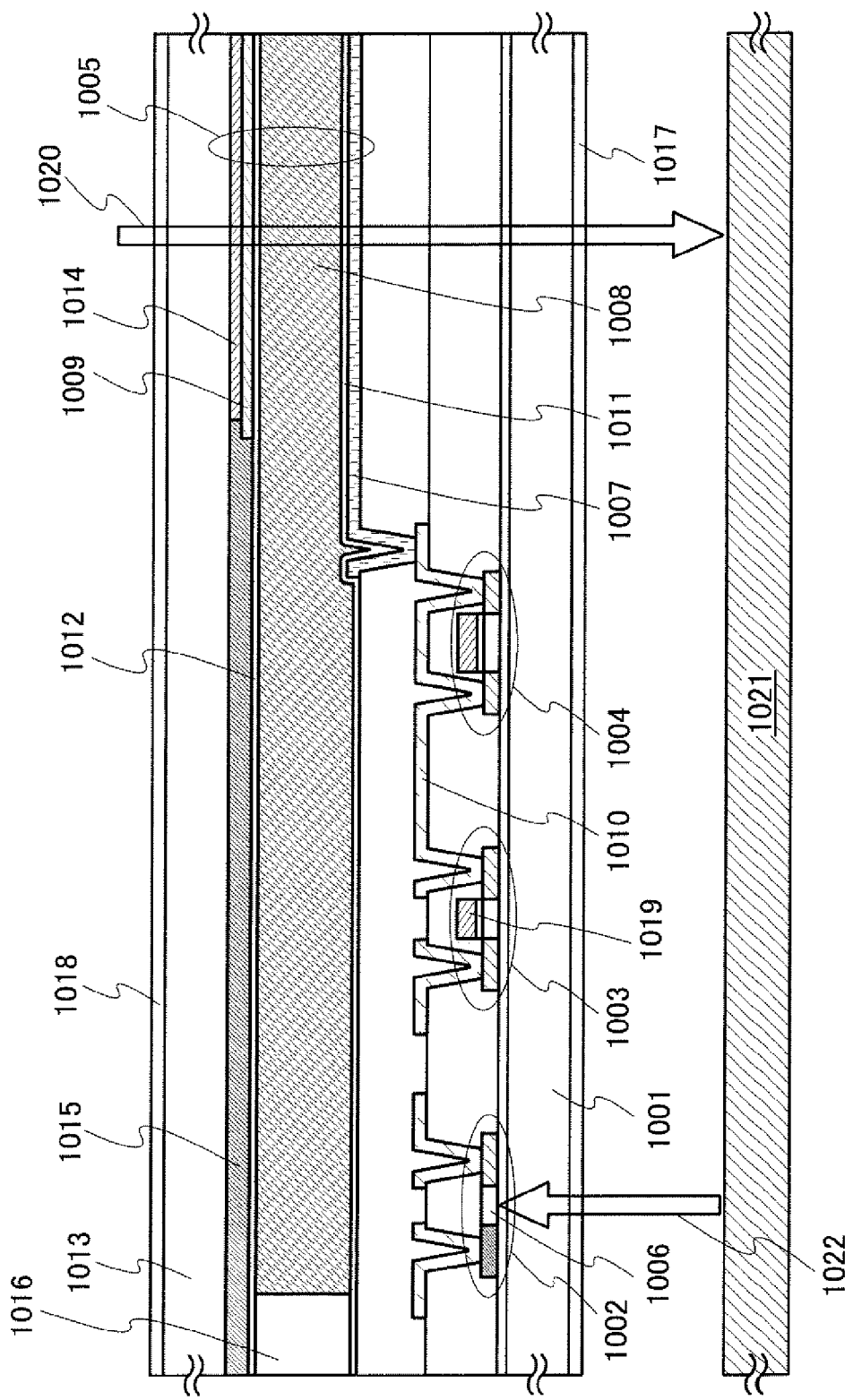
FIG. 7 illustrates a cross-sectional view of a display device.

FIG. 7 illustrates an example of a cross-sectional view of the display panel. In the display panel in FIG. 7, a photodiode 1002, a transistor 1003, a storage capacitor 1004, and a liquid crystal element 1005 are provided over a substrate (TFT substrate) 1001 having an insulating surface.

The photodiode 1002 and the storage capacitor 1004 can be formed at the same time as the transistor 1003 is formed in a manufacturing process of the transistor 1003. The photodiode 1002 is a lateral-junction pin diode. A semiconductor film 1006 included in the photo diode 1002 has a region having p-type conductivity (p layer), a region having i-type conductivity (i layer), and a region having n-type conductivity (n layer). Note that although the case where the photodiode 1002 is a pin diode is illustrated in this embodiment, the photodiode 1002 may be a pn diode. The lateral pin junction or lateral pn junction can be formed by adding impurities imparting p-type conductivity and an impurity imparting n-type conductivity to respective particular regions in the semiconductor film 1006.

Further, it is possible to form an island-shaped semiconductor film of the photodiode 1002 and an island-shaped semiconductor film of the transistor 1003 at the same time by processing (patterning) one semiconductor film deposited on the TFT substrate 1001 in a desired shape by etching or the like; therefore, a step generally added to a panel manufacturing process is unnecessary, achieving cost reduction.

The liquid crystal element 1005 includes a pixel electrode 1007, a liquid crystal 1008, and a counter electrode 1009. The pixel electrode 1007 is formed over the substrate 1001 and is electrically connected to the transistor 1003 through the storage capacitor 1004 and a conductive film 1010. Further, the counter electrode 1009 is formed over a substrate (a counter substrate) 1013, and the liquid crystal 1008 is sandwiched between the pixel electrode 1007 and the counter electrode 1009. Note that although a transistor used for a photosensor is not illustrated in this embodiment, the transistor can be formed over the substrate (TFT substrate) 1001 together with the transistor 1003 in the manufacturing process for the transistor 1003.

A cell gap between the pixel electrode 1007 and the counter electrode 1009 can be controlled by using a spacer 1016. Although the cell gap is controlled by the columnar spacer 1016 which is selectively formed by photolithography in FIG. 7, the cell gap can alternatively be controlled by sphere spacers dispersed between the pixel electrode 1007 and the counter electrode 1009.

Further, between the substrate (TFT substrate) 1001 and the substrate (the counter substrate) 1013, the liquid crystal 1008 is surrounded by a sealing compound. The liquid crystal 1008 may be injected by a dispenser method (droplet method) or a dipping method (pumping method).

As the pixel electrode 1007, a light-transmitting conductive material can be used; for example, indium tin oxide (ITO), indium tin oxide containing silicon oxide (ITSO), organoindium, organotin, zinc oxide, indium zinc oxide (IZO) containing zinc oxide, zinc oxide containing gallium, tin oxide ($SnO_2$), indium oxide containing tungsten oxide, indium zinc oxide containing tungsten oxide, indium oxide containing titanium oxide, indium tin oxide containing titanium oxide, or the like can be used In addition, since the transparent liquid crystal element 1005 is given as an example, the above-described light-transmitting conductive material can be used also for the counter electrode 1009 like in the case of the pixel electrode 1007 in this embodiment.

An alignment film 1011 is provided between the pixel electrode 1007 and the liquid crystal 1008 and an alignment film 1012 is provided between the counter electrode 1009 and the liquid crystal 1008. The alignment film 1011 and the alignment film 1012 can be formed using an organic resin such as polyimide or polyvinyl alcohol. An alignment treatment such as rubbing is performed on their surfaces in order to align liquid crystal molecules in certain direction. Rubbing can be performed by rolling a roller wrapped with cloth of nylon or the like while applying pressure on the alignment film so that the surface of the alignment film is rubbed in certain direction. Note that by using an inorganic material such as silicon oxide, the alignment film 1011 and the alignment film 1012 each having an alignment property can be directly formed by evaporation method without performing an alignment treatment.

Further, a color filter 1014 capable of transmitting light with a particular wavelength is formed over the substrate (counter substrate) 1013 so as to overlap with the liquid crystal element 1005. The color filter 1014 can be selectively formed by photolithography after application of an organic resin such as an acrylic-based resin in which colorant is dispersed on the substrate 1013. Alternatively, color filter 1014 can be selectively formed by etching after application of a polyimide-based resin in which colorant is dispersed on the substrate 1013. Alternatively, the color filter 1014 can be selectively formed by a droplet discharge method such as an ink jet method.

Further, a shielding film 1015 capable of shielding light is formed over the substrate (the counter substrate) 1013 so as to overlap with the photodiode 1002. The shielding film 1015 not only prevents light from the backlight that has passed through the substrate (the counter substrate) 1013 and has entered the display panel from directly striking the photodiode 1002, but prevents disclination due to orientation disorder of the liquid crystal 1008 between the pixels from being recognized. The shielding film 1015 can be formed using an organic resin containing a black pigment such as carbon black or titanium lower oxide. Alternatively, a film of chromium can be used for the shielding film 1015.

Further, a polarizing plate 1017 is formed on a surface opposite to a surface of the substrate (the TFT substrate) 1001 over which the pixel electrode 1007 is formed, and a polarizing plate 1018 is formed on a surface opposite to the surface of the substrate (the counter substrate) 1013 over which the counter electrode 1009 is formed.

The liquid crystal element can include TN (twisted nematic) mode, VA (vertical alignment) mode, OCB (optically compensated birefringence) mode, IPS (in-plane switching) mode, or the like. Note that although an example of the liquid crystal element 1005 in which the liquid crystal 1008 is interposed between the pixel electrode 1007 and the counter electrode 1009 is given in this embodiment, the display panel in one embodiment of the present invention is not limited to this structure. A liquid crystal element in which a pair of electrodes is formed on the substrate (TFT substrate) 1001 side like an IPS mode liquid crystal element may also be employed.

In addition, although an example in which a thin semiconductor film is used for the photodiode 1002, the transistor 1003, and the storage capacitor 1004 is illustrated in this embodiment, a single crystal semiconductor substrate, an SOI substrate, or the like can be used for the photodiode 1002, the transistor 1003, and the storage capacitor 1004.

In a cross-sectional structure shown in this embodiment, light from the backlight is delivered from the substrate (the counter substrate) 1013 side, that is, light from the backlight passes through the liquid crystal element 1005 and is delivered to an object 1021 on the substrate (TFT substrate) 1001 side as shown by an arrow 1020. Then, light which is reflected off the object 1021, shown by the arrow 1022 enters the photodiode 1002.

Additionally, in the display device of this embodiment, a light receiving surface of the photosensor (the photodiode 1002) and a display surface of the display panel (on the side of the substrate 1001) face in the same direction. Therefore, the object can be captured by the display panel, and the display device of this embodiment is more efficient than the device provided with a CCD image sensor or the like.

With the above structure, a display panel capable of capturing an image with high precision can be provided.

This embodiment can be implemented in combination with any other embodiments and examples as appropriate.

(Embodiment 4)

Figure 8:
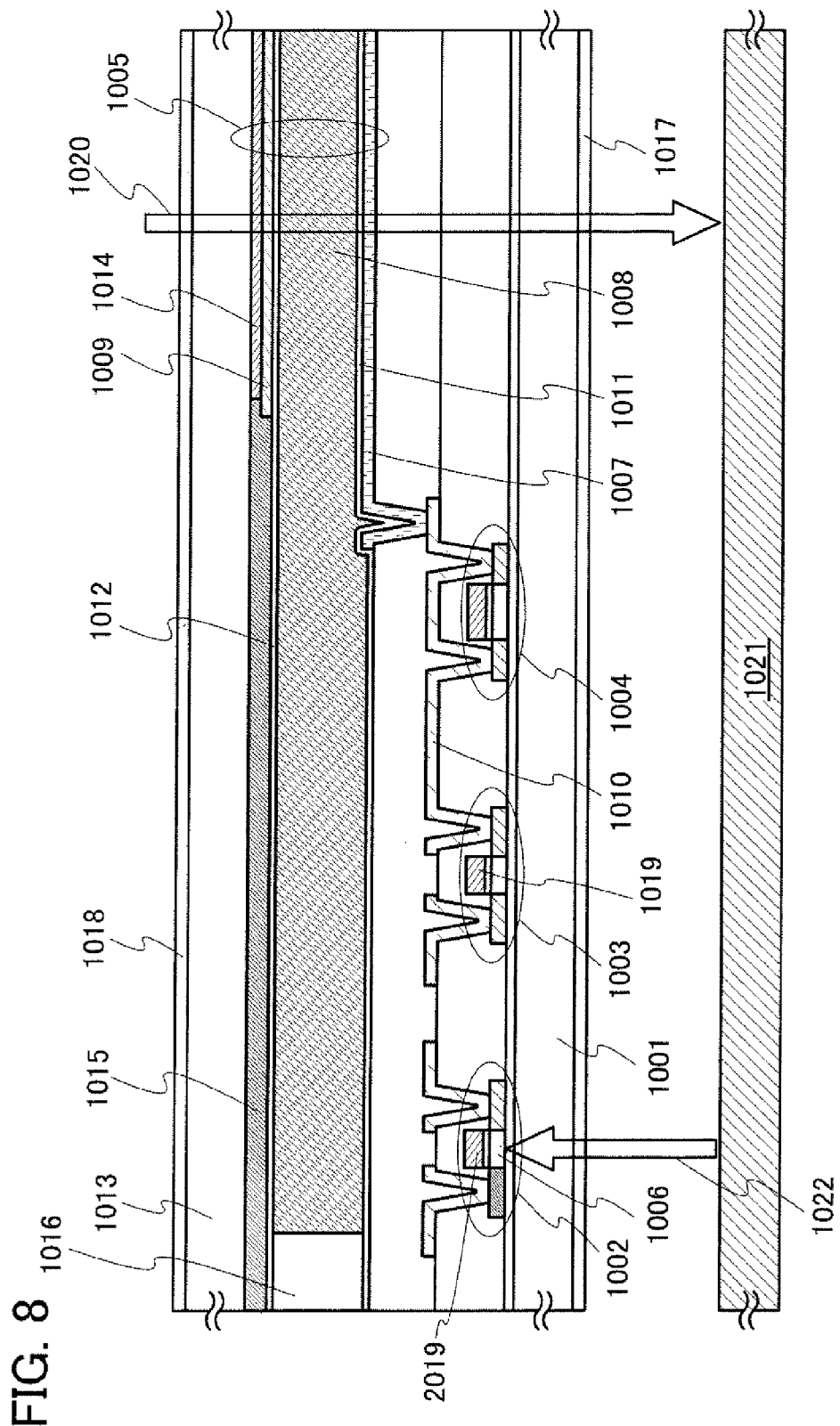
FIG. 8 illustrates a cross-sectional view of a display device.

FIG. 8 illustrates a cross sectional view of a display panel different from that in Embodiment 3. In the display panel shown in FIG. 8, the photodiode 1002 differs from that in FIG. 7 in having a shielding film 2019 formed using a conductive film 1019 that is used for a gate electrode of the transistor 1003. By the shielding film 2019 in the photodiode 1002, light from the backlight is prevented from directly entering a region that has i-type conductivity (i-type layer) and only light reflected off the object can be efficiently detected.

Further, in the case where the photodiode 1002 serves as a lateral pin diode, a region that has p-type conductivity (a p-type layer) and a region that has n-type conductivity (n-type layer) can be formed in self-aligned manner by using the shielding film as a mask. This is effective in manufacturing a minute photodiode, in reducing the pixel size, and in improving the aperture ratio.

With the above structure, a display device capable of capturing an image with high precision can be provided.

This embodiment can be implemented in combination with any other embodiments and examples as appropriate.

(Embodiment 5)

Figure 12:
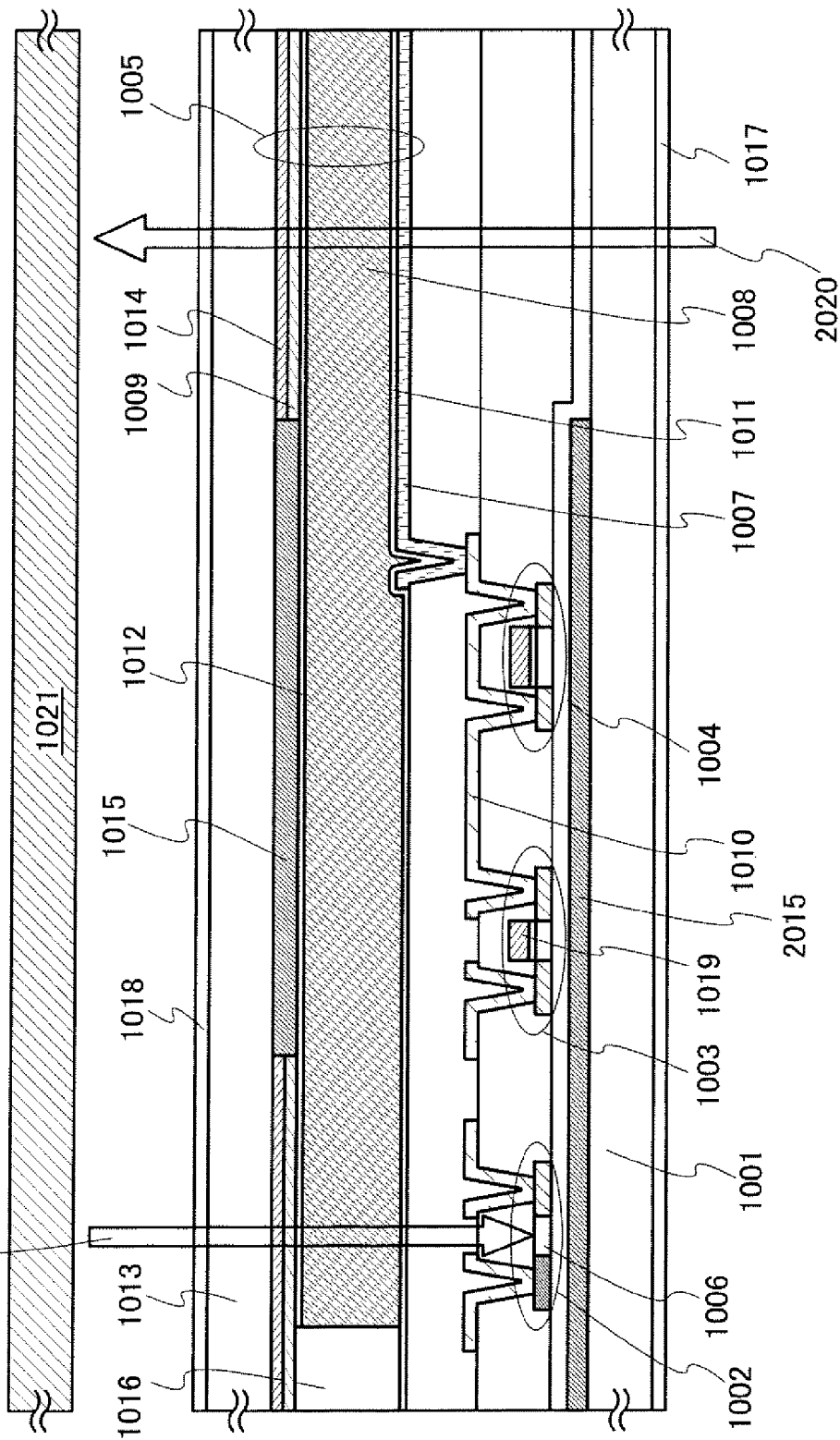
FIG. 12 illustrates a cross-sectional view of a display device.

FIG. 12 illustrates an example of a cross-sectional view of a display panel different from that in Embodiment 3. The display panel illustrated in FIG. 12 is different from the display panels illustrated in FIG. 7 in that light from the backlight is delivered from the TFT substrate 1001 side. In other words, the light from the backlight passes through the liquid crystal element 1005 and reaches the object 1021 on the substrate (counter substrate) 1013 side as shown by an arrow 2020. Then, light reflected by the object 1021 as shown by an arrow 2022 enters the photodiode 1002. In this case, an opening may be formed in the shielding film 1015 above the photodiode 1002 for example, so that light reflected from the object 1021 can be incident on the photodiode 1002.

In this embodiment, a shielding film 2015 is provided under the photodiode 1002. The shielding film 2015 can prevent the light from the backlight that has passed through the substrate (TFT substrate) 1001 and has entered the display panel from reaching the photodiode 1002 directly; thus, a display panel capable of capturing an image with high precision can be provided. The shielding film 2015 can be formed using an organic resin containing a black pigment such as a carbon black or titanium lower oxide. Alternatively, a film of chromium can be used for the shielding film 2015.

Additionally, in the display device of this embodiment, a light receiving surface of the photosensor (the photodiode 1002) and a display surface of the display panel (on the side of the substrate 1013) face in the same direction. Therefore, the object can be captured by the display panel, and the display device of this embodiment is more efficient than the device provided with a CCD image sensor or the like.

This embodiment can be implemented in combination with any other embodiments and examples as appropriate.

(Embodiment 6)

An example of a writing board (such as a blackboard and a whiteboard) using a display panel having a photosensor will be described.

Figure 13:
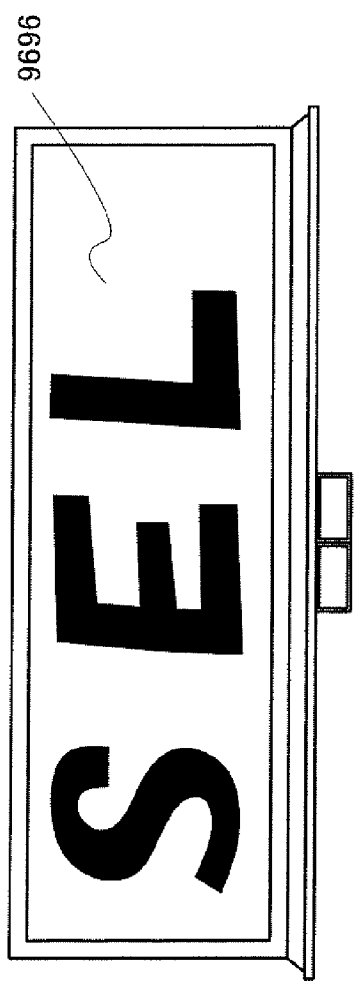
FIG. 13 illustrates an example of an electronic device using a display device.

For example, the display panel including a photosensor is illustrated in FIG. 13.

The display panel 9696 includes a photosensor and a display element.

Here, it is possible to freely write down letters on the surface of the display panel 9696, with a marker pen or the like.

Note that it is easy to erase letters if the letters are written with a marker pen or the like without fixer.

In addition, preferably, the surface of the display panel 9696 is adequately smooth in order that the ink of marker pen may easily be removed.

For example, the surface of the display panel 9696 is adequately smooth if made using a glass substrate or the like.

Further, a transparent sheet of synthetic resin or the like can be laminated to the surface of the display panel 9696.

Preferably, acrylic resin, for example, is used as the synthetic resin. In this case, the surface of the sheet of synthetic resin is preferably smooth.

Since the panel 9696 has the display element, a particular image can be displayed on the display panel 9696 and something can be written with the marker over the surface of the display panel 9696.

In addition, since the display panel 9696 has the photosensor, text written with the marker can be read and printed by connecting the panel 9696 to a printer or the like.

Further, since the display panel 9696 has the photosensor and the display element, by writing text, creating drawings, or the like on the surface of the display panel 9696 with an image displayed, a trail of the marker read by the photosensor and the image can be synthesized and displayed on the panel 9696.

Note that sensing with resistive touch sensors, capacitive touch sensors, or the like can be performed only at the same time as writing with a marker pen or the like.

On the other hand, sensing with a photosensor is superior in that sensing can be performed anytime after something is written with a marker or the like, even if time has passed.

This embodiment can be implemented in combination with any other embodiments and examples as appropriate.

EXAMPLE 1

In this example, the arrangement of a panel and light sources in a display panel according to the present invention will be described.

Figure 9:
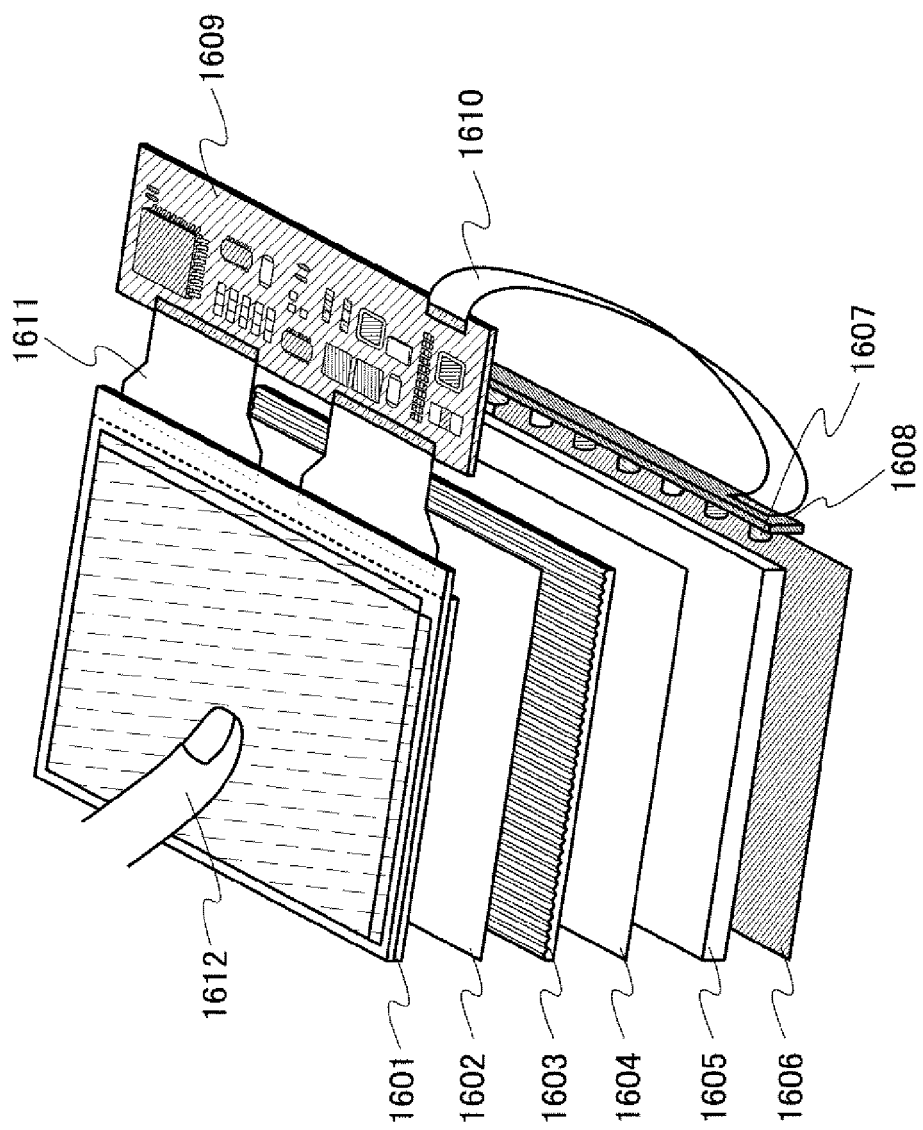
FIG. 9 illustrates a structure of a display device.

FIG. 9 illustrates an example of a perspective view showing the structure of a display panel of the present invention. The display panel shown in FIG. 9 includes a panel 1601 in which a pixel including a liquid crystal element, a photodiode, a thin film transistor, and the like is formed between a pair of substrates; a first diffuser plate 1602; a prism sheet 1603; a second diffuser plate 1604; a light guide plate 1605; a reflective plate 1606; a backlight 1608 including a plurality of light sources 1607; and a circuit board 1609.

The panel 1601, the first diffuser plate 1602, the prism sheet 1603, the second diffuser plate 1604, the light guide plate 1605, and the reflective plate 1606 are stacked in this order. The light sources 1607 are provided at an end portion of the light guide plate 1605. Light from the light sources 1607 which is diffused in the light guide plate 1605 is uniformly emitted to the panel 1601 from the counter substrate side by the first diffuser plate 1602, the prism sheet 1603, and the second diffuser plate 1604.

Although the first diffuser plate 1602 and the second diffuser plate 1604 are used in this example, the number of diffuser plates is not limited thereto. The number of diffuser plates may be one, or may be three or more. The diffuser plate may be provided between the light guide plate 1605 and the panel 1601. Therefore, the diffuser plate may be provided only on the side closer to the panel 1601 than the prism sheet 1603, or may be provided only on the side closer to the light guide plate 1605 than the prism sheet 1603.

Further, the shape of the cross section of the prism sheet 1603, which is shown in FIG. 9, is not only serrate; the shape may be a shape with which light from the light guide plate 1605 can be gathered to the panel 1601 side.

The circuit board 1609 is provided with a circuit for generating or processing various signals to be input to the panel 1601, a circuit for processing various signals to be output from the panel 1601, and the like. In addition, in FIG. 9, the circuit board 1609 and the panel 1601 are connected to each other via an FPC (flexible printed circuit) 1611. Note that the above circuit may be connected to the panel 1601 by a chip on glass (COG) method. or part of the above circuit may be connected to the FPC 1611 by a chip on film (COF) method.

FIG. 9 illustrates an example in which a control circuit for controlling the driving of the light sources 1607 is provided for the circuit board 1609, and the control circuit and the light sources 1607 are connected to each other via the FPC 1610. However, the above described control circuit may be formed over the panel 1601, and in that case, the panel 1601 and the light sources 1607 are made to be connected to each other via an FPC or the like.

Note that although FIG. 9 illustrates an edge-light type light source in which the light sources 1607 are provided on the edge of the panel 1601, a display panel according to the present invention may be a direct type display panel in which the light sources 1607 are provided directly below the panel 1601.

For example, when a finger 1612 as an object, gets close to the panel 1601 from the TFT substrate side, part of light that passes through the panel 1601 from the backlight 1608 reflects off the finger 1612 and enters the panel 1601 again. Color image data of the finger 1612 as the object, can be obtained by sequentially lighting the light sources 1607 that correspond to individual colors and obtaining image data of every color.

This example can be implemented in combination with any other embodiments and examples as appropriate.

EXAMPLE 2

A display panel according to one embodiment of the present invention is characterized by obtaining image data with high precision. Therefore, an electronic device using the display panel in one embodiment of the present invention can be equipped with higher-performance applications by employing the display panel as its component. The display panel of the present invention can be used for display devices, laptops, or image reproducing devices provided with recording media (typically devices which reproduce the content of recording media such as DVDs (digital versatile disc) and have displays for displaying the reproduced images). Further, the electronic devices including the display panel according to an embodiment of the present invention include mobile phones, portable game machines, portable information terminals, e-book readers, cameras such as video cameras or digital still cameras, goggle-type displays (head mounted displays), navigation systems, audio reproducing devices (for example, car audio systems or digital audio players), copying machines, facsimiles, printers, versatile printers, automated teller machines (ATMs), vending machines, and the like. Specific examples of such electronic devices are shown in FIGS. 10A to 10D.

Figure 10A:
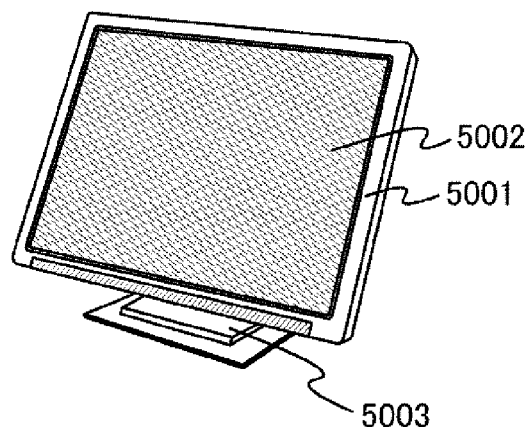
FIGS. 10A to 10D illustrate examples of electronic devices using display devices.

FIG. 10A illustrates a display device that includes a housing 5001, a display portion 5002, a support 5003, and the like. The display panel in one embodiment of the present invention can be used for the display portion 5002. The display panel according to one embodiment of the present invention used for the display portion 5002 can provide a display device capable of capturing image data with high precision and being equipped with higher-performance applications. Note that the display device includes all display devices for displaying information, such as display devices for personal computers, display devices for receiving TV broadcast, and display devices for advertisements, in its category.

Figure 10B:
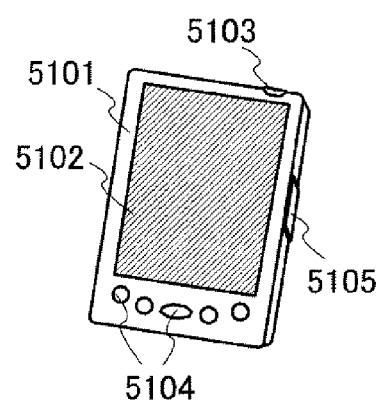

FIG. 10B illustrates a portable information terminal which includes a housing 5101, a display portion 5102, a switch 5103, operation keys 5104, an infrared port 5105, and the like. The display panel according to one embodiment of the present invention can be used for the display portion 5102. The display panel according to one embodiment of the present invention used for the display portion 5102 can make it possible to provide a portable information terminal capable of capturing image data with high precision and being equipped with higher-performance applications.

Figure 10C:
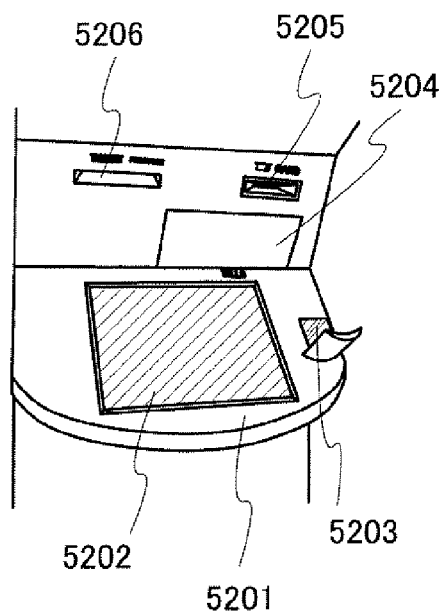

FIG. 10C illustrates an automated teller machine which includes a housing 5201, a display portion 5202, a coin slot 5203, a bill slot 5204, a card slot 5205, a passbook slot 5206, and the like. A display panel according to one embodiment of the present invention can be used for the display portion 5202. The display panel according to one embodiment of the present invention used for the display portion 5202 can make it possible to provide an automated teller machine capable of capturing image data with high precision and being equipped with higher-performance applications. An automated teller machine using a display panel according to one embodiment of the present invention can read, with higher precision, biological information to be used for biometric authentication, such as a fingerprint, a face, a hand print, a palm print, a hand vein pattern, or an iris. Therefore, a false non-match rate which is the rate at which a person to be identified is recognized as a different person and a false acceptance rate which is the rate at which a different person is recognized as a person to be identified in biometric authentication can be suppressed.

Figure 10D:
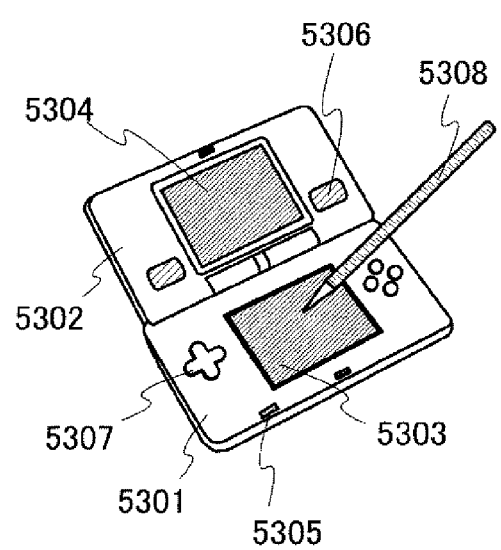

FIG. 10D illustrates a portable game machine which includes a housing 5301, a housing 5302, a display portion 5303, a display portion 5304, a microphone 5305, a speaker 5306, an operation key 5307, a stylus 5308, and the like. The display panel according to one embodiment of the present invention can be used for the display portion 5303 or the display portion 5304. The display panel according to one embodiment of the present invention used for the display portion 5303 or the display portion 5304 can make it possible to provide a portable game machine capable of capturing image data with high precision and being equipped with higher-performance applications. Note that although the portable game machine illustrated in FIG. 10D includes two display portions, namely the display portion 5303 and the display portion 5304, the number of display portions included in the portable game machine is not limited thereto.

This example can be implemented in combination with any other embodiments and examples as appropriate.

This application is based on Japanese Patent Application serial no. 2009-258667 filed with Japan Patent Office on Nov. 12, 2009, the entire contents of which are hereby incorporated by reference.

What is claimed is:

1. A display device comprising:
   a display panel having a photosensor; and
   an image processing circuit operationally connected to the display panel,
   wherein the photosensor is configured to capture a black image, a white image and an image of an object,
   wherein the image processing circuit is configured to produce an image having data represented by a formula: $MAX \times (Z-X)/(Y-X)$,
   wherein MAX represents a maximum value of a gray scale,
   wherein X represents data of the black image,
   wherein Y represents data of the white image, and
   wherein Z represents data of the image of the object.

2. The display device according to claim 1, wherein the photosensor is configured to capture the black image and the white image in a reset operation.

3. The display device according to claim 1, further comprising a memory device configured to store the image of the object, the black image and the white image.

4. A semiconductor device comprising:
   an input portion having a photosensor; and
   an image processing circuit operationally connected to the input portion,
   wherein the photosensor is configured to capture a black image, a white image and an image of an object,
   wherein the image processing circuit is configured to produce an image having data represented by a formula: $MAX \times (Z-X)/(Y-X)$,
   wherein MAX represents a maximum value of a gray scale,
   wherein X represents data of the black image,
   wherein Y represents data of the white image, and
   wherein Z represents data of the image of the object.

5. The semiconductor device according to claim 4, wherein the photosensor is configured to capture the black image and the white image in a reset operation.

6. The semiconductor device according to claim 4, further comprising a memory device configured to store the image of the object, the black image and the white image.

7. A driving method of a semiconductor device comprising:
   capturing a black image, a white image, and an image of an object by a photosensor; and
   producing an image having data represented by a formula: $MAX \times (Z-X)/(Y-X)$ by an image processing circuit operationally connected to the photosensor,
   wherein X represents data of the black image,
   wherein Y represents data of the white image, and
   wherein Z represents data of the image of the object.

8. The driving method of a semiconductor device according to claim 7, wherein the step of capturing the black image and the white image is performed in a reset operation of the photosensor.

* * * * *